United States Patent
Cassidy et al.

(10) Patent No.: US 12,056,598 B2
(45) Date of Patent: *Aug. 6, 2024

(54) RUNTIME RECONFIGURABLE NEURAL NETWORK PROCESSOR CORE

(71) Applicant: INTERNATIONAL BUSINESS MACHINES CORPORATION, Armonk, NY (US)

(72) Inventors: Andrew S. Cassidy, Austin, TX (US); Rathinakumar Appuswamy, San Jose, CA (US); John V. Arthur, Mountain View, CA (US); Pallab Datta, San Jose, CA (US); Steven K. Esser, San Jose, CA (US); Myron D. Flickner, San Jose, CA (US); Jennifer Klamo, San Jose, CA (US); Dharmendra S. Modha, San Jose, CA (US); Hartmut Penner, San Jose, CA (US); Jun Sawada, Austin, TX (US); Brian Taba, Cupertino, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/046,301

(22) Filed: Oct. 13, 2022

(65) Prior Publication Data

US 2023/0062217 A1    Mar. 2, 2023

Related U.S. Application Data

(63) Continuation of application No. 16/012,475, filed on Jun. 19, 2018, now Pat. No. 11,501,140.

(51) Int. Cl.
*G06N 3/063*    (2023.01)
*G06N 3/048*    (2023.01)
(Continued)

(52) U.S. Cl.
CPC ............. *G06N 3/063* (2013.01); *G06N 3/048* (2023.01); *G06N 3/08* (2013.01); *G06N 5/04* (2013.01); *G11C 11/54* (2013.01)

(58) Field of Classification Search
None
See application file for complete search history.

(56) References Cited

U.S. PATENT DOCUMENTS 11,501,140 B2 * 11/2022 Cassidy .................. G11C 11/54
2010/0217735 A1    8/2010 Matsumura et al.
(Continued)

FOREIGN PATENT DOCUMENTS

CN    104641385 A    5/2015
JP    H03250244 A   11/1991
(Continued)

OTHER PUBLICATIONS

Zhang, et al., Analyzing and Mitigating the Impact of Permanent Faults on a Systolic Array Based Neural Network Accelerator, arXiv:1802.04657, Feb. 17, 2018, pp. 1-6 (Year: 2018).*

(Continued)

*Primary Examiner* — Wilbert L Starks
(74) *Attorney, Agent, or Firm* — Erik A. Huestis; Sameer K. Pai; Foley Hoag LLP

(57) ABSTRACT

Hardware neural network processors, are provided. A neural core includes a weight memory, an activation memory, a vector-matrix multiplier, and a vector processor. The vector-matrix multiplier is adapted to receive a weight matrix from the weight memory, receive an activation vector from the activation memory, and compute a vector-matrix multiplication of the weight matrix and the activation vector. The vector processor is adapted to receive one or more input vector from one or more vector source and perform one or more vector functions on the one or more input vector to (Continued)

yield an output vector. In some embodiments a programmable controller is adapted to configure and operate the neural core.

24 Claims, 9 Drawing Sheets

(51) Int. Cl.
  *G06N 3/08* (2023.01)
  *G06N 5/04* (2023.01)
  *G11C 11/54* (2006.01)

(56) References Cited

U.S. PATENT DOCUMENTS

| | | |
|---|---|---|
| 2013/0212053 A1 | 8/2013 | Yagi et al. |
| 2015/0262059 A1 | 9/2015 | Esser et al. |
| 2017/0103321 A1 | 4/2017 | Henry et al. |
| 2017/0220929 A1 | 8/2017 | Rozen et al. |
| 2019/0385048 A1 | 12/2019 | Cassidy et al. |

FOREIGN PATENT DOCUMENTS

| | | |
|---|---|---|
| JP | H08161282 A | 6/1996 |
| JP | 2000/322400 A | 11/2000 |
| JP | 2001/188767 A | 7/2001 |
| JP | 2015/534172 A | 11/2015 |
| JP | 2018/060268 A | 4/2018 |
| WO | 2014/041443 A1 | 3/2014 |

OTHER PUBLICATIONS

Abdelsalam, et al., A Configurable FPGA Implementation of the Tanh Function using DCT Interpolation, 2017 IEEE 25th Annual International Symposium on Field-Programmable Custom Computing Machines, 2017, pp. 168-171 (Year: 2017).*
Notice of Reasons for Refusal Translation for JP Application No. 2020/560976 dated Nov. 4, 2022.
Abdelsalam et al., "A Configurable FPGA Implementation of the Tanh Function using DCT Interpolation," IEEE 25th Annual International Symposium on Field-Programmable Custom Computing Machines, 168-171 (2017).
International Search Report and Written Opinion for International Application No. PCT/IB2019/054954 dated Oct. 12, 2019.
Response to United Kingdom Examination Report for UK Application No. 2100512.9 dated Apr. 8, 2021.
United Kingdom Examination Report for Application No. GB2100512.9 dated May 27, 2021.
Zhang et al., "Analyzing and Mitigating the Impact of Permanent Faults on a Systolic Array Based Neural Network Accelerator," arXiv, 1802:04657 (6 pages) (2018).
Zhang, Z. & Friedriech, K. (2003). "Artificial Neural Networks Applied to Polymer Composites: a review." Composites Science and Technology, 63(14), 2029-2044.
List of IBM Patents or Patent Applications Treated as Related (Appendix P). Dated Oct. 13, 2022.

* cited by examiner

RUNTIME RECONFIGURABLE NEURAL NETWORK PROCESSOR CORE

CROSS-REFERENCE TO RELATED APPLICATIONS

This application is a continuation of U.S. application Ser. No. 16/012,475, filed Jun. 19, 2018, which is hereby incorporated by reference in its entirety.

BACKGROUND

Embodiments of the present disclosure relate to hardware neural network processors, and more specifically, to runtime reconfigurable neural network processor core.

BRIEF SUMMARY

According to embodiments of the present disclosure, neural cores are provided. A neural core includes a weight memory, an activation memory, a vector-matrix multiplier, and a vector processor. The vector-matrix multiplier is adapted to receive a weight matrix from the weight memory, receive an activation vector from the activation memory, and compute a vector-matrix multiplication of the weight matrix and the activation vector. The vector processor is adapted to receive one or more input vector from one or more vector source and perform one or more vector functions on the one or more input vector to yield an output vector. In some embodiments a programmable controller is adapted to configure and operate the neural core.

DETAILED DESCRIPTION

Figure 1:
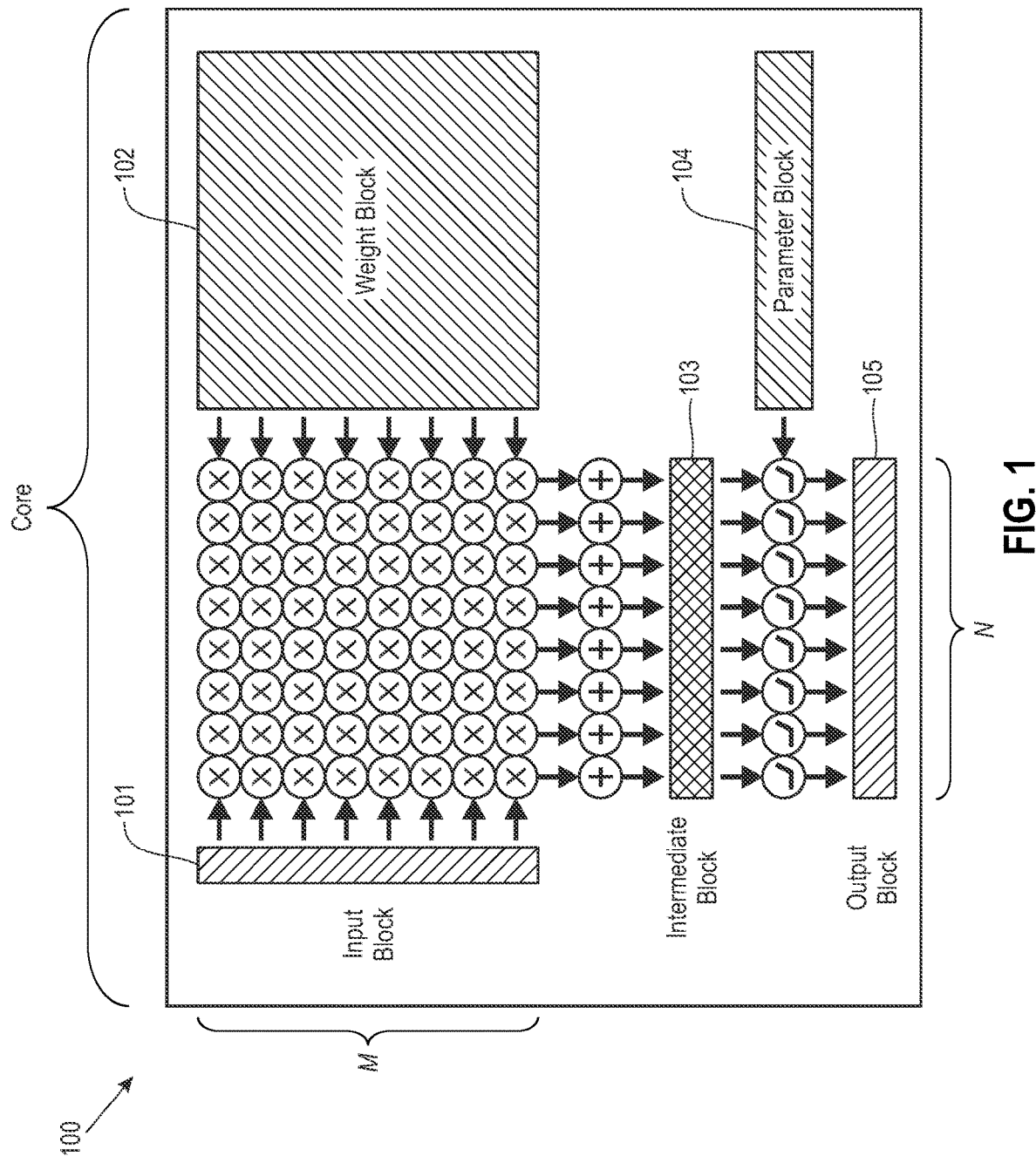
FIG. 1 illustrates a neural core according to embodiments of the present disclosure.

An artificial neuron is a mathematical function whose output is a nonlinear function of a linear combination of its inputs. Two neurons are connected if the output of one is an input to the other. A weight is a scalar value encoding the strength of the connection between the output of one neuron and the input of another neuron.

A neuron computes its output, called an activation, by applying a nonlinear activation function to a weighted sum of its inputs. A weighted sum is an intermediate result computed by multiplying each input with the corresponding weight and accumulating the products. A partial sum is a weighted sum of a subset of inputs. A weighted sum of all inputs may be computed in stages by accumulating one or more partial sums.

A neural network is a collection of one or more neurons. A neural network is often divided into groups of neurons called layers. A layer is a collection of one or more neurons that all receive input from the same layers and all send output to the same layers, and typically perform a similar function. An input layer is a layer that receives input from a source outside the neural network. An output layer is a layer that sends output to a target outside the neural network. All other layers are intermediate processing layers. A multilayer neural network is a neural network with more than one layer. A deep neural network is a multilayer neural network with many layers.

A tensor is a multidimensional array of numerical values. A tensor block is a contiguous subarray of the elements in a tensor.

Each neural network layer is associated with a parameter tensor V, weight tensor W, input data tensor X, output data tensor Y, and intermediate data tensor Z. The parameter tensor contains all of the parameters that control neuron activation functions a in the layer. The weight tensor contains all of the weights that connect inputs to the layer. The input data tensor contains all of the data that the layer consumes as input. The output data tensor contains all of the data that the layer computes as output. The intermediate data tensor contains any data that the layer produces as intermediate computations, such as partial sums.

The data tensors (input, output, and intermediate) for a layer may be 3-dimensional, where the first two dimensions may be interpreted as encoding spatial location and the third dimension as encoding different features. For example, when a data tensor represents a color image, the first two dimensions encode vertical and horizontal coordinates within the image, and the third dimension encodes the color at each location. Every element of the input data tensor X can be connected to every neuron by a separate weight, so the weight tensor W generally has 6 dimensions, concatenating the 3 dimensions of the input data tensor (input row a, input column b, input feature c) with the 3 dimensions of the output data tensor (output row i, output column j, output feature k). The intermediate data tensor Z has the same shape as the output data tensor Y. The parameter tensor V concatenates the 3 output data tensor dimensions with an additional dimension o that indexes the parameters of the activation function σ.

An element of a layer's output data tensor Y can be computed as in Equation 1 where the neuron activation function σ is configured by the vector of activation function parameters V[i,j,k,:], and the weighted sum Z[i,j,k] can be computed as in Equation 2.

$$Y[i, j, k] = \sigma(V[i, j, k, :]; Z[i, j, k]) \quad \text{Equation 1}$$

$$Z[i, j, k] = \sum_{a=1}^{A}\sum_{b=1}^{B}\sum_{c=1}^{C} W[i, j, k, a, b, c] \cdot X[a, b, c] \quad \text{Equation 2}$$

For simplicity of notation, the weighted sum in Equation 2 may be referred to as the output, which is equivalent to using a linear activation function $Y[i,j,k]=\sigma(Z[i,j,k])=Z[i,j,k]$, with the understanding that the same statements apply without loss of generality when a different activation function is used.

In various embodiments, computation of the output data tensor as described above is decomposed into smaller problems. Each problem may then be solved on one or more neural core, or on one or more core of a conventional multicore system in parallel.

With reference now to FIG. 1, a neural core according to embodiments of the present disclosure is depicted. A neural core 100 is a tileable computational unit that computes one block of an output tensor. A neural core 100 has M inputs and N outputs. In various embodiments, M=N. To compute an output tensor block, a neural core multiplies an M×1 input tensor block 101 with an M×N weight tensor block 102 and accumulates the products into weighted sums that are stored in a 1×N intermediate tensor block 103. A O×N parameter tensor block contains the O parameters that specify each of the N neuron activation functions that are applied to the intermediate tensor block 103 to produce a 1×N output tensor block 105.

Multiple neural cores may be tiled in a neural core array. In some embodiments, the array is 2-dimensional.

A neural network model is a set of constants that collectively specify the entire computation performed by a neural network, including the graph of connections between neurons as well as the weights and activation function parameters for every neuron. Training is the process of modifying the neural network model to perform a desired function. Inference is the process of applying a neural network to an input to produce an output, without modifying the neural network model.

An inference processing unit is a category of processors that perform neural network inference. A neural inference chip is a specific physical instance of an inference processing unit.

Figure 2:
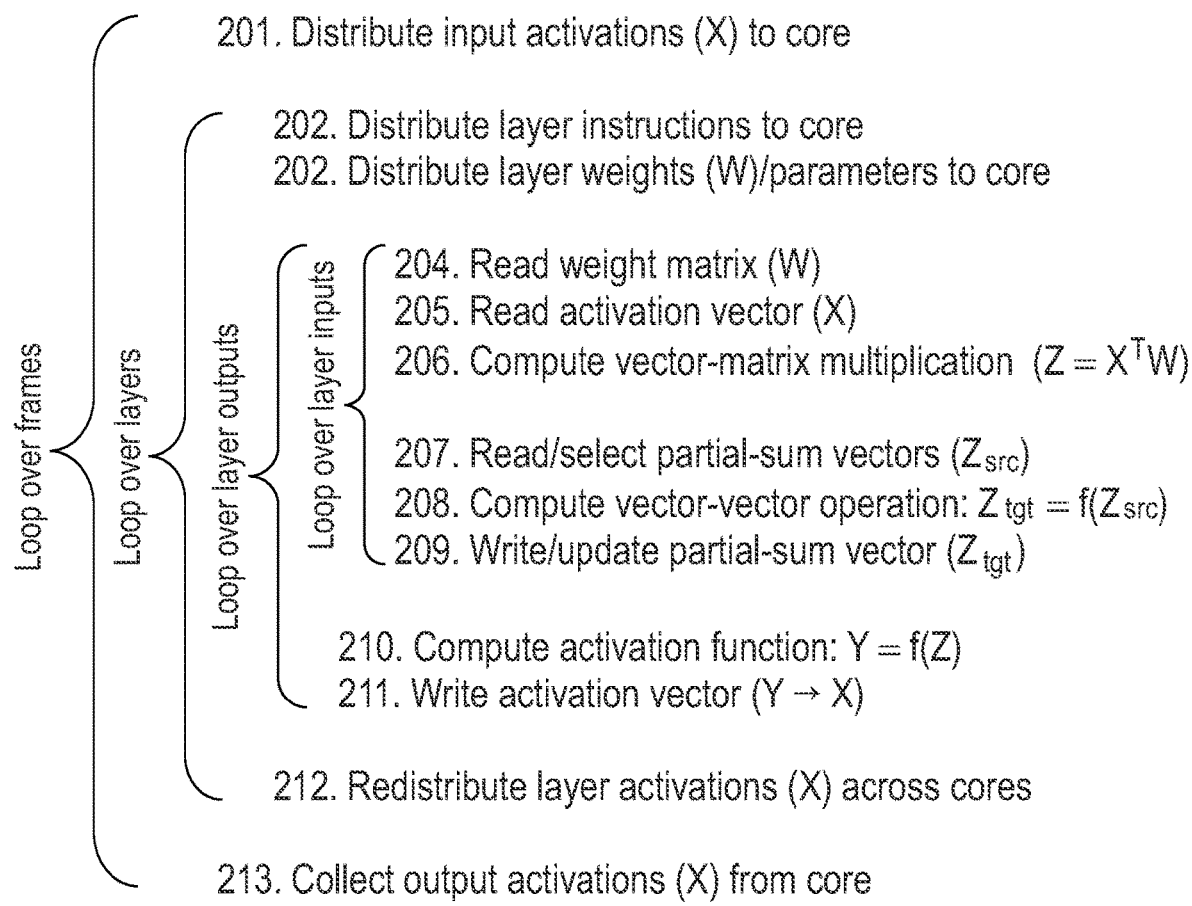
FIG. 2 illustrates logical operations executed by an inference processing unit according to embodiments of the present disclosure.

At a high level, the logical operations executed by an inference processing unit are shown in FIG. 2. At 201, input activations (X) are distributed to cores. At 202, layer instructions are distributed to cores. At 203, layer weights (W) and/or parameters are distributed to cores. At 204, matrix weights (W) are read. At 205, an activation vector (X) is read. At 206, vector-matrix multiplication ($Z=X^TW$) is computed. At 207, partial-sum vectors ($Z_{src}$) are read and/or selected. At 208, vector-vector functions $Z_{tgt}=f(Z_{src})$ are computed. At 209, partial-sum vector ($Z_{tgt}$) is written and or updated. At 210, the activation function (Y=f(Z)) is computed. At 211, the activation vector (Y→X) is written. At 212, layer activations (X) are redistributed across cores. At 213, output activations (X) are collected from cores.

As shown, steps 201 . . . 213 are repeated over all input frames. Steps 202 . . . 212 are repeated over all layer of a neural network. Steps 204 . . . 211 are repeated over all layer outputs. Steps 204 . . . 209 are repeated over all layer inputs.

Figure 3:
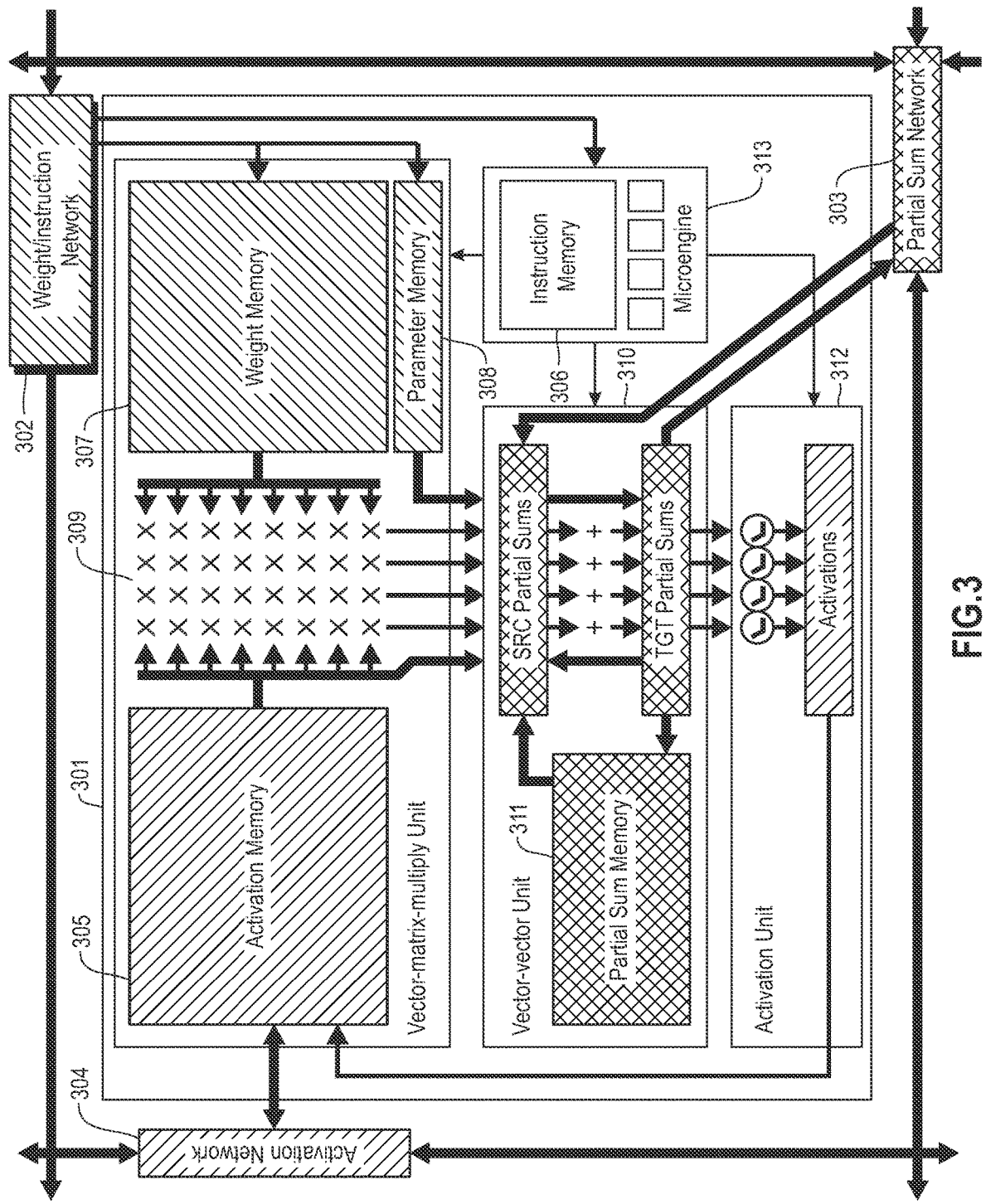
FIG. 3 illustrates a neural core and associated networks according to embodiments of the present disclosure.

With reference now to FIG. 3, an exemplary neural core and associated networks are illustrated according to embodiments of the present disclosure. Core 301, which may be embodied as described with reference to FIG. 1 is interconnected with additional cores by networks 302 . . . 304. In this embodiments, network 302 is responsible for distributing weights and/or instructions, network 303 is responsible for distributing partial sums, and network 304 is responsible for distributing activations. However, it will be appreciated that the various embodiments of the present disclosure may combine these networks, or further separate them into multiple additional networks.

Referring to FIG. 3, input activations (X) are distributed at step 201 to core 301 from off-core via activation network 304 to activation memory 305. Layer instructions are distributed at step 202 to core 301 from off-core via weight/ instruction network 302 to instruction memory 306. Layer weights (W) and/or parameters are distributed at step 203 to core 301 from off-core via weight/instruction network 302 to weight memory 307 and/or parameter memory 308.

The weight matrix (W) is read at step 204 from weight memory 307 by Vector Matrix Multiply (VMM) unit 309. The activation vector (V) is read at step 205 from activation memory 305 by Vector Matrix Multiply (VMM) unit 309. Vector Matrix Multiply (VMM) unit 309 then computes vector-matrix multiplication $Z=X^TW$ at step 206 and provides the result to Vector-Vector unit 310. At step 207, Vector-Vector unit 310 reads additional partial sums from partial sum memory 311, and receives additional partial sums from off-core via partial sum network 303. At step 208, a vector-vector operation is computed by Vector-Vector unit 310 from these source partial sums. For example, the various partial sums may in turn be summed. At step 209, the resulting target partial sums are written to partial sum memory 311, sent off-core via partial sum network 303, and/or fed back for further processing by Vector-Vector unit 310.

The partial sum results from Vector-Vector unit 310, after all computation for a given layer's inputs is complete, are provided to activation unit 312 for the computation of output activations at step 210. At step 211, the activation vector (Y) is written to activation memory 305. At step 212, layer activations (including the results written to activation memory) are redistributed across cores from activation memory 305 via activation network 304. Upon receipt, they are written to local activation memory to each receiving core. Upon completion of processing for a given frame, the output activations are read from activation memory 305 and sent off-core via network 304.

Figure 4A:
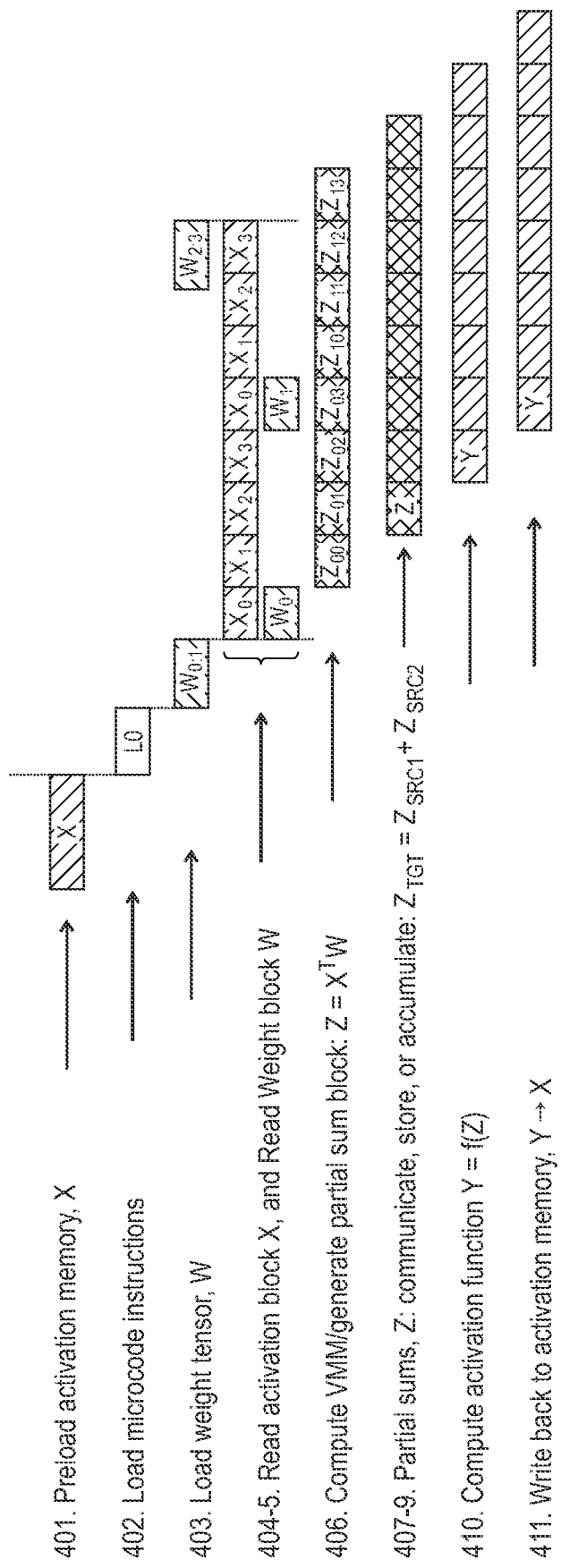
FIGS. 4A-B, are core timing diagrams for exemplary spatial and filter inner loops according to embodiments of the present disclosure.
Figure 4B:
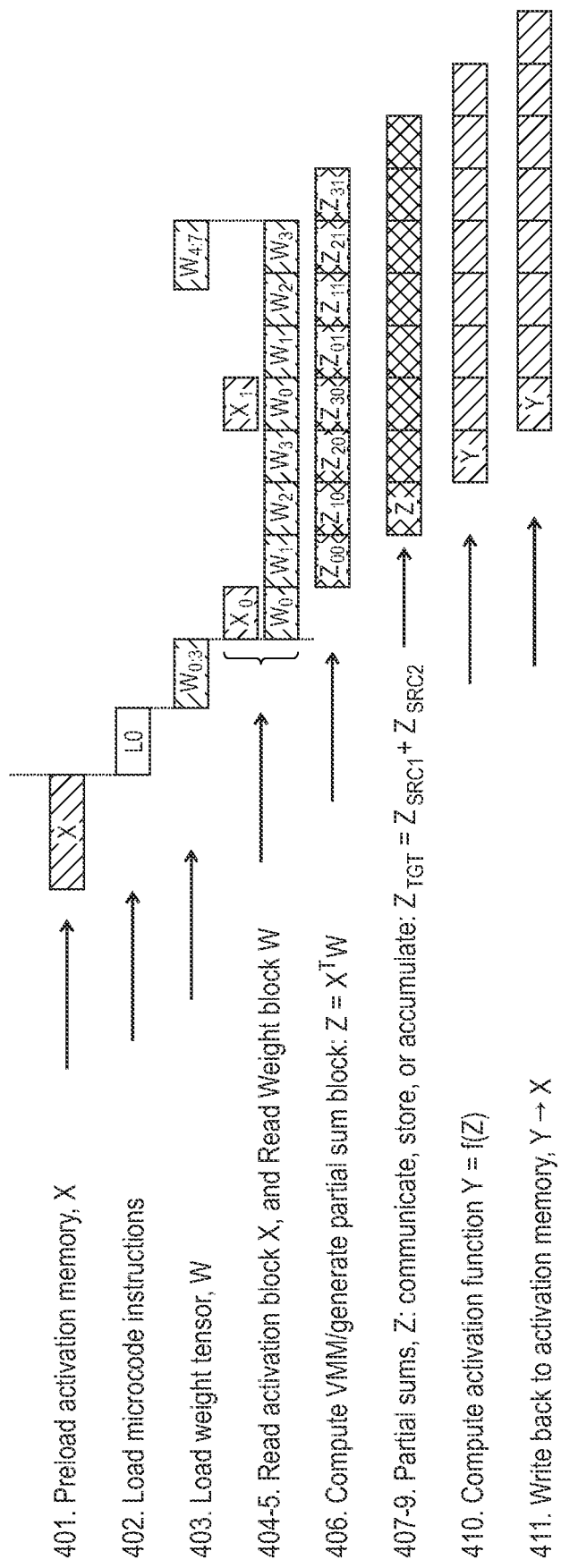

Referring to FIGS. 4A-B, core timing diagrams are provided for an exemplary spatial inner loop and filter inner loop. At 401, the activation memory is preloaded with activations X. At 402, microcode instructions are loaded. At 403, the weight tensor W is loaded. At 404-5, activation blocks and weight blocks are read. At 406, partial sum blocks are computed. At 407-9, partial sum blocks are communicated, stored, and/or accumulated. At 410, an activation function is computed. At 411, the activations are written back to activation memory. It will be appreciated that the steps in these timing diagrams corresponds to the steps described with reference to FIG. 2. In FIG. 4A, which depicts a spatial inner loop, activation blocks $X_0 \ldots X_3$ are loaded for each weight block $W_0 \ldots W_1$, allowing computation of partial sum blocks $Z_{00} \ldots Z_{03}, Z_{10} \ldots Z_{13}$. In FIG. 4B, which depicts a filter inner loop, weight blocks $W_0 \ldots W_3$ are loaded for each activation block $X_0 \ldots X_1$, allowing computation of partial sum blocks $Z_{00} \ldots Z_{30}, Z_{01} \ldots Z_{31}$.

Accordingly, in operation, a core control microengine (e.g., 313) orchestrates the data movement and computation of the core. The microengine issues a read activation memory address operation to load an input activation block into the vector-matrix multiply unit. The microengine issues a read weight memory address operation to load a weight block into the vector-matrix multiply unit. The microengine issues the vector-matrix multiply unit a compute operation, such that vector-matrix multiply unit compute array computes a partial sum block.

The microengine issues one or more of a partial sum read/write memory address operation, vector compute operation, or partial sum communication operation in order to do one or more of the following: read partial sum data from partial sum sources; compute using partial sums arithmetic units; or write partial sum data to partial sum targets.

Writing partial sum data to partial sum targets may include communicating external to the core via the partial sum network interface or sending partial sum data to the activation arithmetic unit.

The microengine issues an activation compute operation, such that the activation arithmetic unit computes an output activation block. The microengine issues a write activation memory address and the output activation block is written to the activation memory via the activation memory interface.

Accordingly, a variety of sources, targets, address types, computation types, and control components are defined for a given core.

Sources for vector-vector unit 310 include Vector Matrix Multiply (VMM) unit 309, activation memory 305, constants from parameter memory 308, partial sum memory 311, partial sum results from prior cycles (TGT partial sums); and partial sum network 303.

Targets for vector-vector unit 310 include partial sum memory 311, partial sum results for subsequent cycles (SRC partial sums), activation unit 312, and partial sum network 303.

Accordingly, a given instruction may read or write from activation memory 305, read from weight memory 307, or read or write from partial sum memory 311. Compute operations performed by the core include vector matrix multiplication by VMM unit 309, vector (partial sum) operations by vector unit 310, and activation functions by activation unit 312.

Control operations include program counters and loop and/or sequence counters.

Thus, steps 204 . . . 211 can be mapped to operations as follows. In steps 204, 205, 207, 209, 211 memory operations are issued to read weight from addresses in weight memory, read parameters from addresses in parameter memory, read activations from addresses in activation memory, and read/write partial sums to addresses in partial sum memory. At steps 206, 208, 210, computation operations are issued to perform vector-matrix multiplication, vector-vector operations, and activation functions. At steps 207, 209, communication operations are issued to select the vector-vector operands, route messages on the partial sum network, and select partial sum targets. The loop over layer outputs (at steps 204 . . . 211) and the loop over layer inputs (at steps 204 . . . 209) are controlled by control operations specifying program counters, loop counters, and sequence counters.

Figure 5:
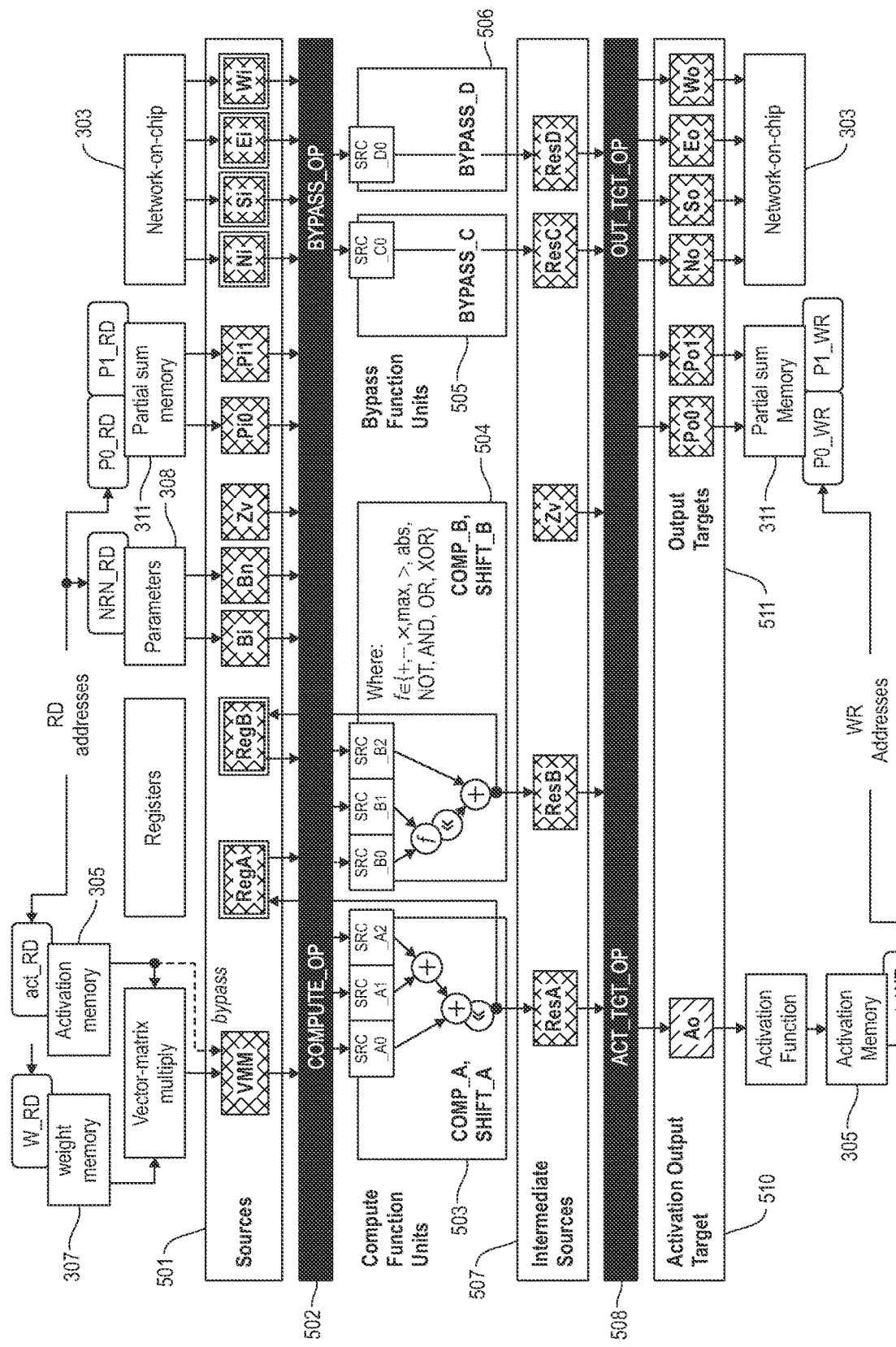
FIG. 5 is a detail view of a vector unit according to embodiments of the present disclosure.

Referring to FIG. 5, a detail view of a vector unit slice according to embodiments of the present disclosure is provided. A vector unit has many vector unit slices, to operate on all the elements of a vector in parallel, so just a slice is depicted here. In some embodiments, all slices of the vector unit perform the same operations at the same time on their respective vector elements in parallel. Sources 501 correspond to the sources described above. In particular, weight memory 307 is accessed at read address W_RD and activation memory 305 is accessed at read address act_RD to provide input to vector-matrix multiplication, the result of which in turn serves as a source to the vector-vector unit. Parameter memory 308 is accessed at read address NRN_RD to provide parameters to the vector-vector unit. Partial sum memory 311 is accessed at read address P0_RD and P1_RD to retrieve partial sum operands for the vector-vector unit. The network on chip 303 is used to provide partial sum inputs to the vector-vector unit. As pictured, inputs are received from four cardinal directions, north, south, east, and west. However, it will be appreciated that a variety of network configurations may be used according to the present disclosure to allow receipt of inputs from arbitrary cores.

Operations 502 include Compute OPs (COMPUTE_OP) and Bypass OPs (BYPASS_OP). Compute OPs Map sources 501 to the compute function units 503, 504 (A and B) and specify computation to be performed by the compute function units. Bypass OPs (BYPASS_OP) Map sources 501 to bypass function units 505, 506 (C and D). The results of computation or bypass make up intermediate sources 507.

Operations 508 on intermediate sources 507 include Output Target OPs (OUT_TGT_OP) and Activation Output Target OP (ACT_TGT_OP). Output Target Ops Map intermediate sources 507 to output targets 509. Activation Output Target OPs Map intermediate sources 50 to activation output target 510 and specify computation to be performed by the activation function unit.

The results of the activation function are written to activation memory 305 at write address act_WR. Partial sums are written to partial sum memory 311 at write addresses P0_WR and P1_WR. Network outputs are sent via network 303. As pictured, outputs are sent to four cardinal directions, north, south, east, and west. However, it will be appreciated that a variety of network configurations may be used according to the present disclosure to allow sending output to arbitrary cores.

It will be appreciated that a given core may include a plurality of function units. Accordingly, FIG. 5 depicts one slice of a vector-vector unit for simplicity of description.

Referring to Table 1, an exemplary partial sum data operations format is provided. In Table 1, Bypass OPs include BYPASS_C_OP and BYPASS_D_OP, corresponding to the separate bypasses 505, 506 described above. Target Output OPs include OUT_TGT_OP, COND_TGT_OP, and ACT_TGT_OP. Compute operations follow the ACT_TGT_OP.

TABLE 1

| Name | Index | Operand 0 | Operand 1 | Operand 2 |
|---|---|---|---|---|
| NOP | 0 | — | — | — |
| SHIFT_OP | 1 | PIPE | TYPE | MAGNITUDE |
| BYPASS_C_OP | 2 | — | SRC_C0 | — |
| BYPASS_D_OP | 3 | — | SRC_D0 | — |
| OUT_TGT_OP | 4 | — | INT_SRC | TGT |
| COND_TGT_OP | 5 | INT_SRC0 | INT_SRC1 | TGT |
| ACT_TGT_OP | 6 | ACT_FX, ACT_OUT | ACT_SHIFT | INT_SRC |
| VADD_A | 7 | SRC_A0 | SRC_A1 | SRC_A2 |
| VADD_B | 8 | SRC_B0 | SRC_B1 | SRC_B2 |
| VSUB_B | 9 | SRC_B0 | SRC_B1 | SRC_B2 |
| VMAC_B | 10 | SRC_B0 | SRC_B1 | SRC_B2 |
| VCMP_B | 11 | SRC_B0 | SRC_B1 | SRC_B2 |
| VMAX_B | 12 | SRC_B0 | SRC_B1 | SRC_B2 |
| VABS_B | 13 | SRC_B0 | — | SRC_B2 |
| VLIM_B | 14 | IMM_4b_1 | IMM_4b_0 | SRC_B2 |
| VNOT_B | 15 | SRC_B0 | — | SRC_B2 |
| VAND_B | 16 | SRC_B0 | SRC_B1 | SRC_B2 |
| VOR_B | 17 | SRC_B0 | SRC_B1 | SRC_B2 |
| VXOR_B | 18 | SRC_B0 | SRC_B1 | SRC_B2 |

Table 2 lists the sources in the embodiments described above.

TABLE 2

| Name | Description |
|---|---|
| Pi0 | partial sum memory, read port 0 |
| Pi1 | partial sum memory, read port 1 |

TABLE 2-continued

| Name | Description |
|---|---|
| Ni | Network on Chip North input port |
| Si | Network on Chip South input port |
| Ei | Network on Chip East input port |
| Wi | Network on Chip West input port |
| VMM | Vector Matrix Multiply Output |
| regA | registered copy of prior result A |
| regB | registered copy of prior result B |
| Bi | (bias) offset const. ($b_j$) |
| Bn | (batch norm) scaling const. ($\alpha_j^{bn}$) |
| Zv | zero vector |

Table 3 lists the intermediate sources in the embodiments described above.

TABLE 3

| Name | Description |
|---|---|
| resA | Result A |
| resB | Result B |
| resC | Result C |
| resD | Result D |
| Zv | zero vector |

Table 4 lists the output targets in the embodiments described above.

TABLE 4

| Name | Description |
|---|---|
| Po0 | Partial sum memory, write port 0 |
| Po1 | Partial sum memory, write port 1 |
| No | Network on Chip North output port |
| So | Network on Chip South output port |
| Eo | Network on Chip East output port |
| Wo | Network on Chip West output port |

Table 5 lists the activation target in the embodiments described above.

TABLE 5

| Name | Description |
|---|---|
| Ao | Output activation function |

Table 6 lists the vector compute operations in the embodiments described above.

TABLE 6

| Name | Index | Description |
|---|---|---|
| VADD_A | 7 | ResA = SRC_A0 + (SRC_A1 + SRC_A2) |
| VADD_B | 8 | ResB = (SRC_B0 + SRC_B1) + SRC_B2 |
| VSUB_B | 9 | ResB = (SRC_B0 − SRC_B1) + SRC_B2 |
| VMAC_B | 10 | ResB = (SRC_B0 [32b] * SRC_B1 [8b]) + SRC_B2 |
| VCMP_B | 11 | ResB = GT(SRC_B0, SRC_B1) + SRC_B2 |
| VMAX_B | 12 | ResB = MAX(SRC_B0, SRC_B1) + SRC_B2 |
| VABS_B | 13 | ResB = ABS(SRC_B0) + SRC_B2 |
| VLIM_B | 14 | ResB = (IMM_4b_1 << 4) + IMM_4b_0 + SRC_B2 |
| VNOT_B | 15 | ResB = (~SRC_B0) + SRC_B2 |
| VAND_B | 16 | ResB = (SRC_B0 & SRC_B1) + SRC_B2 |
| VOR_B | 17 | ResB = (SRC_B0 \| SRC_B1) + SRC_B2 |
| VXOR_B | 18 | ResB = (SRC_B0 ^ SRC_B1) + SRC_B2 |

Referring to Table 7, a summary is provided of various reconfigurable elements of a neural core according to various embodiments of the present disclosure.

TABLE 7

| Unit | Reconfigurable Properties |
|---|---|
| Activation memory | Different sized, dimension activation tensors (input and output), multiple tensors (input and output) |
| Weight memory | Different sized, dimension weight tensors |
| Partial Sum memory | Different sized, dimension output activation tensors require a configurable number of partial sums to be stored |
| Instruction memory | Different instructions per tensor or network layer, depending on tensor sizes, dimensions and operations to be performed |
| Microengine | Different tensor sizes, dimensions and operations to be performed requires control of all of the following: reconfigurable addressing and control, as well as reconfigurable operation execution and reconfigurable data routing; |
| Partial sum accumulation | Different sized output activation tensors require accumulation over time; Different sized weight tensors requires accumulation over space-which may include partial sums from different cores |
| Neural computation | VMM, vector {arithmetic, logical, boolean} operations |
| Neural activation | ReLU, linear, threshold, sigmoid, tanh, arbitrary LUT, etc. |
| Communication | Bypass operations; North, South, East, and West NoC transmission |

Figure 6:
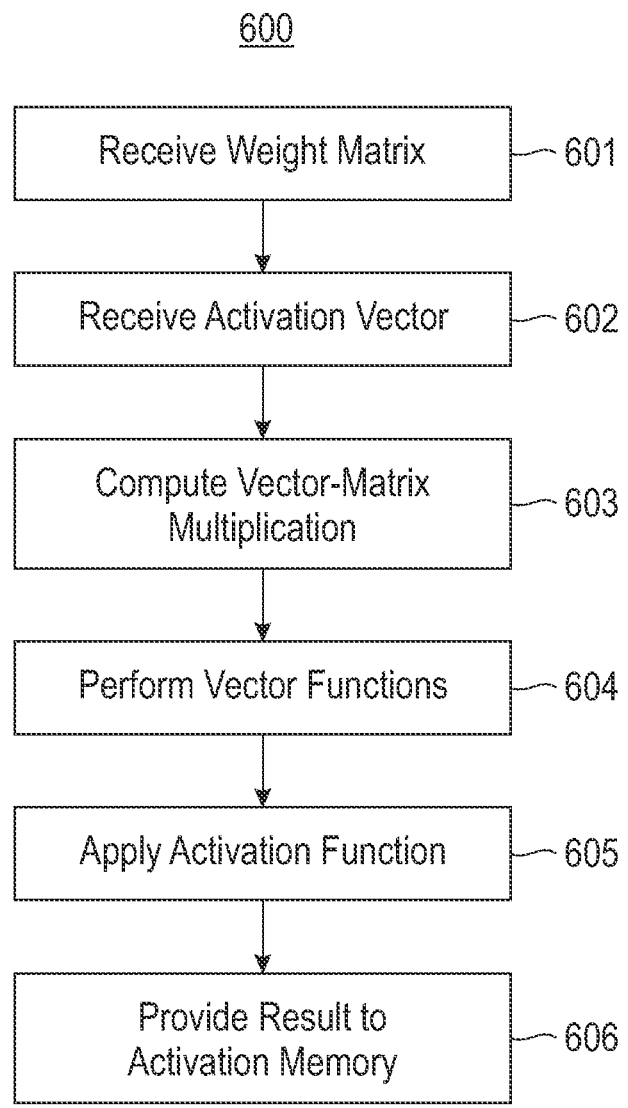
FIG. 6 illustrates a method for configuring a neural core according to embodiments of the present disclosure.

Referring to FIG. 6, a method for operating a neural core according to embodiments of the present disclosure is illustrated. At 601, a weight matrix is receives from a weight memory. At 602, an activation vector is received from an activation memory. At 603, a vector-matrix multiplication is computed of the weight matrix and the activation vector. At 604, one or more vector functions is performed on the vector-matrix multiplication to yield an output vector. At 605, an activation function is applied to the output vector to determine a result. At 606, the result is provided to the activation memory.

Figure 7:
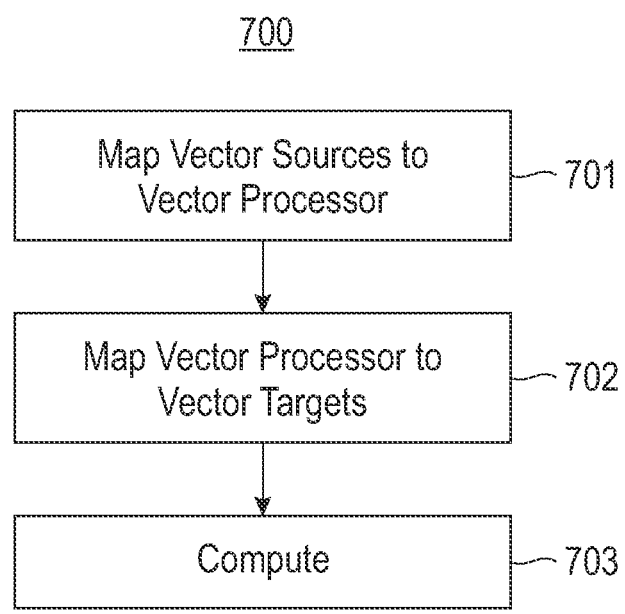
FIG. 7 illustrates a method for configuring a neural core according to embodiments of the present disclosure.

Referring to FIG. 7, a method for configuring a neural core according to embodiments of the present disclosure is illustrated. At 701, a programmable controller maps one or more of a plurality of vector sources to a vector processor. At 702, the programmable controller maps the vector processor to one or more of a plurality of vector targets. At 703, the programmable controller instructs the vector processor to perform a vector function on input from the one or more of the plurality of sources and provide results to the one or more of the plurality of vector targets.

Accordingly, the present disclosure provides runtime reconfigurable neural network processor cores. Such cores are reconfigurable via a programmable controller. In some embodiments, the reconfiguration is performed concurrently with computation in a pipeline.

Figure 8:
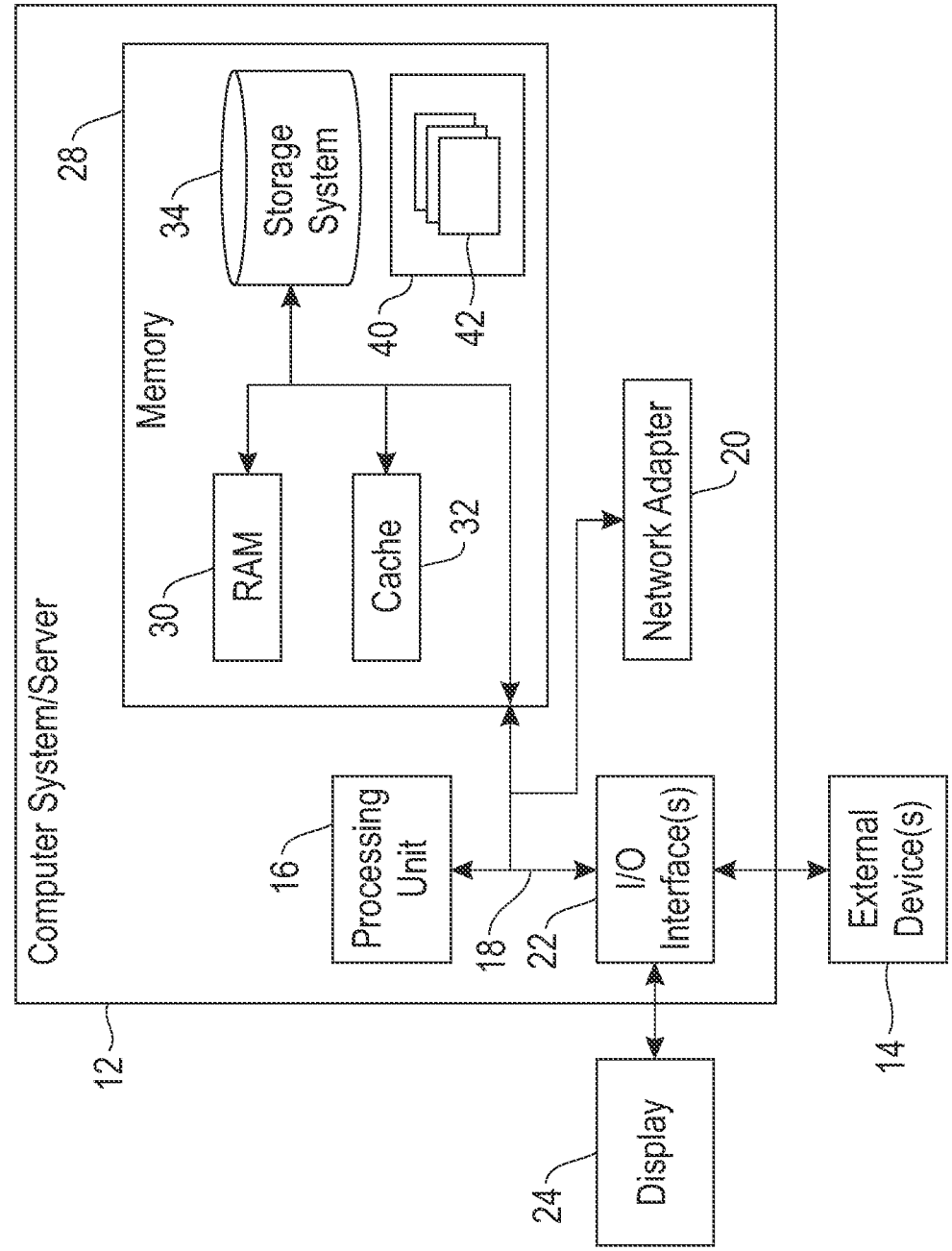
FIG. 8 depicts a computing node according to an embodiment of the present disclosure.

Referring now to FIG. 8, a schematic of an example of a computing node is shown. Computing node 10 is only one example of a suitable computing node and is not intended to suggest any limitation as to the scope of use or functionality of embodiments described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

In various embodiments, one or more inference processing unit (not pictured) is coupled to bus 18. In such embodiments, an IPU may receive data from or write data to memory 28 via bus 18. Likewise, an IPU may interact with other components via bus 18 as described herein.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A neural core device comprising:
   a weight memory;
   an activation memory;
   a vector-matrix multiplier adapted to receive a weight matrix from the weight memory, receive an activation vector from the activation memory, compute a set of partial products by vector-matrix multiplication of the weight matrix and the activation vector, and output the set of partial products; and
   a vector processor adapted to receive one or more input vector including the set of partial products from one or more vector source including the vector matrix multiplier and perform one or more vector functions on the one or more input vector to yield an output vector.

2. The neural core device of claim 1, further comprising a microengine device operatively coupled to the vector processor.

3. The neural core device of claim 2, wherein the microengine device is adapted to:
   map the one or more vector source to the vector processor,
   map the vector processor to one or more vector targets, instruct the vector processor to perform the one or more vector functions and provide the output vector to the one or more vector targets.

4. The neural core device of claim 1, further comprising:
an activation unit operatively coupled to the vector processor and adapted to:
apply an activation function to the results from the vector processor.

5. The neural core device of claim 4, wherein the activation function is configurable.

6. The neural core device of claim 5, wherein:
the microengine device is further adapted to instruct the activation unit to compute the activation function and provide results to the activation memory.

7. The neural core device of claim 1, wherein the one or more vector sources comprise a partial sum memory, a network, a register, or a parameter memory.

8. The neural core device of claim 1, wherein the vector targets comprise an activation memory, a partial sum memory, a register, or a network.

9. The neural core device of claim 1, wherein the vector processor is adapted to apply one or more constant to the results.

10. The neural core device of claim 1, configured to accumulate partial sums.

11. The neural core device of claim 1, wherein:
the microengine device is further adapted to instruct the vector-matrix multiplier to read a weight matrix from the weight memory, read an activation vector from the activation memory, and to compute a vector-matrix multiplication of the weight matrix and the activation vector.

12. The neural core device of claim 11, wherein:
the weight matrix is a subarray of a neural network weight matrix;
the activation vector is a subarray of a neural network activation vector.

13. The neural core device of claim 12, wherein the vector-matrix multiplication of the weight matrix and the activation vector is provided for accumulation, said accumulation yielding a vector-matrix multiplication of the neural network weight matrix and the neural network activation vector.

14. The neural core device of claim 1, configured to compute a neural network function having an input, parameters, and an output.

15. The neural core device of claim 14, wherein the weight matrix and/or the activation vector have configurable sizes.

16. The neural core device of claim 14, wherein the neural network input, parameters, and/or output have configurable sizes.

17. The neural core device of claim 14, wherein the neural network function is configurable.

18. The neural core device of claim 1, configured to compute a neural network function in conjunction with a plurality of additional neural cores interconnected by a network.

19. The neural core device of claim 1, configured to compute a portion of a neural network function.

20. The neural core device of claim 19, wherein the portion of the neural network function is configurable.

21. A method comprising:
receiving a weight matrix from a weight memory;
receiving an activation vector from an activation memory;
computing a set of partial products by vector-matrix multiplication of the weight matrix and the activation vector;
performing one or more vector functions on the set of partial products to yield an output vector;
applying an activation function to the output vector to determine a result; and
providing the result to the activation memory.

22. The method of claim 21, wherein the weight matrix is a subarray of a neural network weight matrix and the activation vector is a subarray of a neural network activation vector, the method further comprising:
accumulating the result with additional results to yield a vector-matrix multiplication of the neural network weight matrix and the neural network activation vector.

23. The method of claim 21, further comprising simultaneously storing the activation vector and the result in the activation memory.

24. A method comprising:
identifying one or more of a plurality of vector sources for a vector processor;
identifying one or more of a plurality of vector targets for the vector processor; and
performing by the vector processor a vector function on input including a set of partial products from the one or more of the plurality of sources and provide results to the one or more of the plurality of vector targets.

* * * * *